US012581686B2

(12) United States Patent
Pandey

(10) Patent No.: US 12,581,686 B2
(45) Date of Patent: Mar. 17, 2026

(54) METAL OXIDE SEMICONDUCTOR DEVICES AND INTEGRATION METHODS

(71) Applicant: GlobalFoundries U.S. Inc., Malta, NY (US)

(72) Inventor: Shesh Mani Pandey, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 503 days.

(21) Appl. No.: 18/046,531

(22) Filed: Oct. 14, 2022

(65) Prior Publication Data

US 2024/0128374 A1    Apr. 18, 2024

(51) Int. Cl.
| | |
|---|---|
| *H10D 30/65* | (2025.01) |
| *H01L 21/762* | (2006.01) |
| *H10D 30/01* | (2025.01) |
| *H10D 64/01* | (2025.01) |
| *H10D 64/23* | (2025.01) |

(52) U.S. Cl.
CPC ..... *H10D 30/657* (2025.01); *H01L 21/76267* (2013.01); *H01L 21/76283* (2013.01); *H10D 30/0281* (2025.01); *H10D 64/01* (2025.01); *H10D 64/254* (2025.01); *H10D 64/258* (2025.01)

(58) Field of Classification Search
CPC .. H10D 30/657; H10D 30/0281; H10D 64/01; H10D 64/254; H10D 64/258; H10D 62/159; H10D 30/64–669; H10D 30/028–0297; H10D 62/152–155; H10D 62/156–159; H10D 30/601–608; H01L 21/76267; H01L 21/76283

See application file for complete search history.

(56) References Cited

U.S. PATENT DOCUMENTS

| | | | | |
|---|---|---|---|---|
| 5,237,193 A | * | 8/1993 | Williams | H10D 30/603 |
| | | | | 257/E29.267 |
| 6,890,804 B1 | * | 5/2005 | Shibib | H10D 30/6733 |
| | | | | 257/E29.279 |
| 8,492,836 B2 | * | 7/2013 | Miura | H10D 64/516 |
| | | | | 257/E29.256 |
| 8,772,871 B2 | * | 7/2014 | Yang | H10D 30/603 |
| | | | | 257/408 |
| 8,853,764 B1 | * | 10/2014 | Zhang | H10D 84/811 |
| | | | | 438/259 |
| 9,245,903 B2 | * | 1/2016 | Cheng | H10D 87/00 |

(Continued)

OTHER PUBLICATIONS

Yan-Hui Zhang, A uniform doping ultra-thin SOI LDMOS with accumulation-mode extended gate and back-side etching technology, Chin. Phys. B, 2016, 027306-1 to 5, vol. 25, No. 2, Chinese Physical Society and IOP Publishing Ltd., China.

(Continued)

*Primary Examiner* — Maliheh Malek
(74) *Attorney, Agent, or Firm* — Francois Pagette

(57) ABSTRACT

A semiconductor device comprises a semiconductor layer over an insulator layer and a base layer under the insulator layer. A well is in the base layer, a doped region is above and coupled with the well, and the doped region is in the insulator layer. A drift region is above and coupled with the doped region, and the drift region is at least partially in the semiconductor layer. A gate stack is partially over the semiconductor layer and partially over drift region.

19 Claims, 7 Drawing Sheets

(56)  References Cited

U.S. PATENT DOCUMENTS

| | | | |
|---|---|---|---|
| 9,460,926 B2 * | 10/2016 | Mallikarjunaswamy | .................... H10D 84/0123 |
| 10,056,481 B2 * | 8/2018 | Schippel | .............. H10D 64/671 |
| 10,468,522 B2 * | 11/2019 | Ryu | ...................... H10D 62/159 |
| 11,545,570 B2 * | 1/2023 | Li | ...................... H10D 30/6744 |
| 11,552,192 B2 * | 1/2023 | Jain | ...................... H10D 62/115 |
| 12,057,475 B2 * | 8/2024 | Lin | ...................... H10D 62/235 |
| 2004/0201061 A1 * | 10/2004 | Jeon | ........................ H10D 30/65 257/E29.066 |
| 2006/0113625 A1 * | 6/2006 | Bude | .................... H10D 62/371 257/493 |
| 2008/0111154 A1 * | 5/2008 | Voldman | .............. H10D 84/403 257/E27.098 |
| 2009/0250772 A1 * | 10/2009 | Botula | ................. H10D 62/151 438/300 |
| 2009/0294849 A1 * | 12/2009 | Min | ..................... H10D 62/371 257/E29.256 |
| 2010/0163979 A1 * | 7/2010 | Hebert | ................. H10D 30/603 257/E29.256 |
| 2011/0241083 A1 * | 10/2011 | Khemka | ............ H10D 30/0221 257/E27.059 |
| 2012/0043608 A1 * | 2/2012 | Yang | .................... H10D 62/156 438/286 |
| 2013/0020587 A1 * | 1/2013 | Hino | .................... H10D 62/393 257/77 |
| 2013/0020632 A1 * | 1/2013 | Disney | .............. H10D 30/0285 257/E21.409 |
| 2014/0264576 A1 * | 9/2014 | Zhang | ..................... H10D 1/47 438/238 |
| 2015/0102407 A1 * | 4/2015 | Lee | ...................... H10D 64/111 438/286 |
| 2015/0145039 A1 * | 5/2015 | Lin | ..................... H10D 30/657 438/151 |
| 2015/0270388 A1 * | 9/2015 | Chan | .................... H10D 62/157 438/286 |
| 2015/0294984 A1 * | 10/2015 | Cheng | .............. H01L 21/76283 438/151 |
| 2015/0380398 A1 * | 12/2015 | Mallikarjunaswamy | .................... H10D 84/82 257/272 |
| 2016/0211367 A1 * | 7/2016 | Ito | ......................... H10D 62/158 |
| 2017/0062415 A1 * | 3/2017 | Mallikarjunaswamy | .................... H10D 62/393 |
| 2017/0194490 A1 * | 7/2017 | Li | ....................... H10D 30/0323 |
| 2017/0243971 A1 * | 8/2017 | Komatsu | .............. H10D 64/516 |
| 2017/0288020 A1 * | 10/2017 | Fang | ................... H10D 62/116 |
| 2018/0204944 A1 * | 7/2018 | Schippel | .............. H10D 62/115 |
| 2019/0288108 A1 * | 9/2019 | Shinohara | ............. H10D 30/65 |
| 2020/0274002 A1 * | 8/2020 | Haynie | ............. H10D 30/0281 |
| 2021/0210630 A1 * | 7/2021 | Li | ....................... H10D 30/6744 |
| 2022/0013542 A1 * | 1/2022 | Wu | ...................... H01L 21/743 |
| 2022/0052156 A1 * | 2/2022 | Kim | .................... H10D 62/116 |
| 2022/0059662 A1 * | 2/2022 | Chung | ................ H10D 62/111 |
| 2022/0115536 A1 * | 4/2022 | Chen | .................... H10D 84/151 |
| 2023/0052949 A1 * | 2/2023 | Lin | .................... H10D 30/0281 |
| 2023/0215939 A1 * | 7/2023 | Du | .................... H01L 21/26546 257/183 |
| 2023/0261004 A1 * | 8/2023 | Chuang | ............. H01L 21/76283 257/347 |
| 2023/0307454 A1 * | 9/2023 | He | ........................ H10D 84/856 |
| 2024/0194783 A1 * | 6/2024 | Pandey | ................ H10D 62/159 |
| 2024/0234533 A1 * | 7/2024 | Sharma | ................. H10D 64/01 |
| 2024/0282852 A1 * | 8/2024 | Pandey | ............. H10D 30/603 |
| 2024/0282853 A1 * | 8/2024 | Pandey | ............. H10D 30/603 |
| 2025/0070044 A1 * | 2/2025 | Snyder | ................ H10D 62/393 |
| 2025/0098209 A1 * | 3/2025 | Li | .......................... H10D 64/01 |
| 2025/0107211 A1 * | 3/2025 | Pandey | ............... H10D 64/671 |

OTHER PUBLICATIONS

Dawei Xu, Multi-Gates SOI LDMOS for Improved on-state Performance, Proceedings of the 26th International Symposium on Power Semiconductor Devices & IC's, Jun. 15-19, 2014, 175-178, IEEE, U.S A.

* cited by examiner

METAL OXIDE SEMICONDUCTOR DEVICES AND INTEGRATION METHODS

FIELD OF THE INVENTION

The disclosed embodiments relate generally to metal oxide semiconductor (MOS) devices, and more particularly, to laterally diffused metal oxide semiconductor (LDMOS) devices with silicon on insulator (SOI) and integration methods.

BACKGROUND

The prolific use of wireless communication products such as mobile phones and base stations have driven demand for high frequency devices, for example, laterally diffused metal oxide semiconductor (LDMOS) devices. The LDMOS devices may be used in radio frequency (900 MHz-2.4 GHz) circuits. Such devices with high operating bandwidth, high breakdown voltage, and high output power are suitable for use in power amplifier of wireless communication base station.

However, current LDMOS devices have a large area due to the laterally diffused drain leading to high cost and scaling challenges. Thereby, there is a need for an improved laterally diffused metal oxide semiconductor structure to overcome the challenges mentioned above.

SUMMARY

According to an embodiment of the invention, a semiconductor device comprises a semiconductor layer over an insulator layer and a base layer under the insulator layer. A well is in the base layer. A doped region is above and coupled with the well, and the doped region is in the insulator layer. A drift region is above and coupled with the doped region, and the drift region is at least partially in the semiconductor layer. A gate stack is partially over the semiconductor layer and partially over drift region.

According to another embodiment of the invention, a semiconductor device comprises a semiconductor layer over an insulator layer and a base layer under the insulator layer. The insulator layer has a bottom surface. A well is in the base layer and the well has a top surface including a first portion contacting the bottom surface of the insulator layer and a second portion adjacent to the first portion. A doped region is above and coupled with the well, and the doped region is in the insulator layer and the doped region has a bottom surface contacting the second portion of the top surface of the well. A drift region is above and coupled with the doped region, and the drift region is at least partially in the semiconductor layer. A gate stack has a first portion over the semiconductor layer and a second portion over drift region, wherein the second portion is adjacent to the first portion.

According to yet another embodiment of the invention, a method of fabricating a semiconductor device comprises forming an opening in a substrate where the substrate comprises a semiconductor layer over an insulator layer and a base layer under the insulator layer, and the opening terminates at the base layer. The method further comprises forming of a well in the base layer under the opening, forming a doped region over the well and within the opening, where the doped region is in the insulator layer. The method further comprises forming of a drift region over the doped region, where the drift region is at least partially in the semiconductor layer. The method further comprises forming of a gate stack partially over the semiconductor layer and partially over drift region.

BRIEF DESCRIPTION OF THE DRAWINGS

The disclosed embodiments will be better understood from a reading of the following detailed description, taken in conjunction with the accompanying drawings.

Figure 1A:
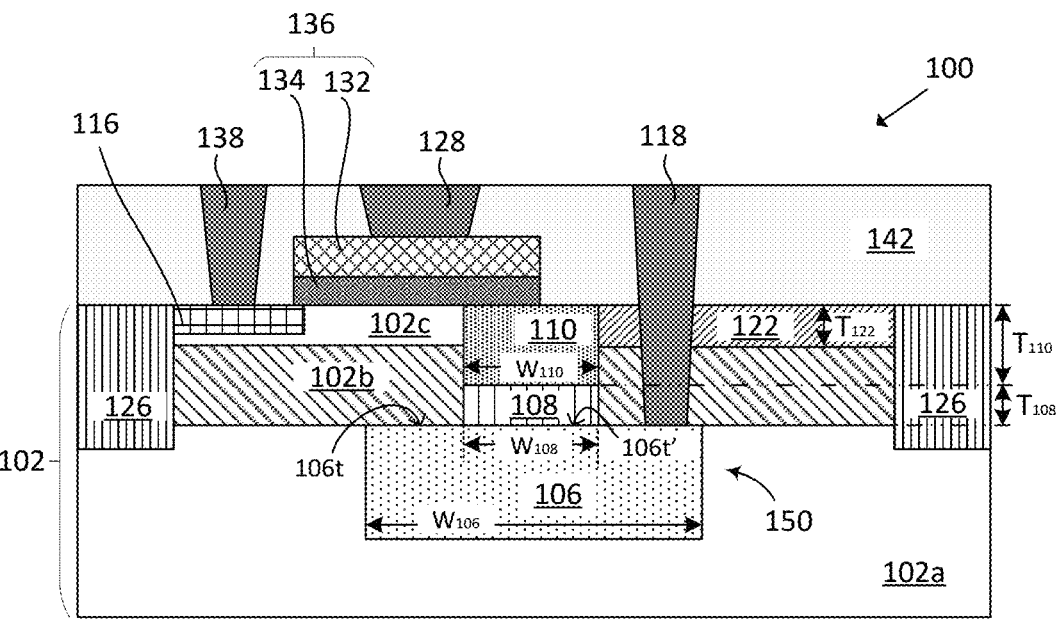
FIG. 1A shows a simplified cross-sectional view of a LDMOS device 100, according to an exemplary embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A shows a device, according to an embodiment of the disclosure. In one embodiment, the device may be an LDMOS device 100. The LDMOS device 100 may include a substrate 102 having a base layer 102a, an insulator layer 102b over the base layer 102a and a semiconductor layer 102c over the insulator layer 102b. In an embodiment, the substrate 102 may be a silicon on insulator (SOI) substrate. The base layer 102a, and semiconductor layer 102c may include a doped silicon, for example, p-type doped silicon, while the insulator layer 102b may include a buried oxide (BOX) layer, such as silicon dioxide. The LDMOS device 100 may also include a drain region 150 in the substrate 102. The drain region 150 may include a drift region 110 over a doped region 108 and a well 106 below the doped region 108. In an embodiment, the drift region 110 directly contacts the doped region 108. In another embodiment, the doped region 108 directly contacts the well 106. The drift region 110 may be in the semiconductor layer 102$c$ and extend into at least a portion of the insulator layer 102$b$. For example, the drift region 110 may have a lower portion that is within the insulator layer 102$b$. The doped region 108 may also be arranged in the insulator layer 102$b$, for example, the doped region 108 may have opposing sidewalls that are in direct contact with the insulator layer 102$b$. The well 106 may be in the base layer 102$a$ and have a top surface that is partially contacting the bottom surface of the insulator layer 102$b$ and partially contacting the bottom surface of the doped region 108. For example, the top surface of the well 106 may include a planar or substantially planar portion 106$t$ that directly contacts the bottom surface of the insulator layer 102$b$ and a portion 106$t'$ that directly contacts the bottom surface of the doped region 108. In an embodiment, the top surface of the well 106 may be continuous and substantially planar. In another embodiment, the top surface of the well 106 may be continuous and planar. In other embodiments, the portion 106$t$ of the top surface of the well 106 that is contacting the bottom surface of the doped region 108 may be higher or lower than the portion 106$t'$ that is contacting the bottom surface of the doped region 108.

The LDMOS device 100 may further include shallow trench isolation (STI) structures 126 formed in the substrate 102. The STI structures 126 may be adjacent to and directly contact side surfaces of the semiconductor layer 102$c$. In some embodiments, the STI structures 126 may extend vertically downwards to directly contact the insulator layer 102$b$. In other embodiments, the STI structures 126 may directly contact the base layer 102$a$. An isolation structure 122 may be arranged directly above and in contact with a portion of the insulator layer 102$b$. In an embodiment, the bottom surface of the isolation structure 122 may be fully in contact with a portion of the top surface of the insulator layer 102$b$. The isolation structure 122 may also be between the drift region 110 and a STI structure 126. In an embodiment, the isolation structure 122 may have a thickness $T_{122}$ that is substantially the same as or equal to the thickness of the semiconductor layer 102$c$. In yet another embodiment, the isolation structure may have a bottom surface that is at the same depth as the bottom surface of the semiconductor layer 102$c$. In other embodiments, the top surface of the isolation structure 122 may be coplanar or substantially coplanar with the top surface of the drift region 110. A drain contact 118 may be laterally spaced from the drift region 110 and extend through the isolation structure 122 and the insulator layer 102$b$ to couple to the well 106. For example, a portion of the insulator layer 102$b$ may be between the drain contact 118 and the drift region 110. In an embodiment, the drain contact 118 may directly contact the top surface of the well 106.

The drift region 110, the doped region 108 and the well 106 may have the same polarity in an embodiment. For example, the drift region 110, well 106 and doped region 108 may all be doped with an n-type dopant. In an embodiment, drift region 110 may have a different doping concentration from the well 106, and the well 106 may have a different doping concentration from the doped region 108. For example, the drift region 110 may have a lower doping concentration than the well 106 and the well 106 may have a lower doping concentration compared to the doped region 108. In another embodiment, the doped region 108 may have a higher doping concentration than the drift region 110 and the well region 106. As an example, the drift region 110 may have a dopant concentration range of $1\times10^{17}$ to $1\times10^{19}$ cm$^{-3}$. The well 106 may have a dopant concentration range of $5\times10^{16}$ to $1\times10^{19}$ cm$^{-3}$. The doped region 108 may have a dopant concentration range of $1\times10^{17}$ to $1\times10^{21}$ cm$^{-3}$.

The drift region 110 may have a width $W_{110}$, the doped region 108 may have a width $W_{108}$ and the well may have a width $W_{106}$. In an embodiment, the doped region 110 may be narrower than the well 106, for example, the width $W_{110}$ of region 110 may be smaller than the width $W_{106}$ of well 106. In another embodiment, the doped region 108 may be narrower than the well 106, for example, the width $W_{108}$ of the doped region 108 may be smaller than the width $W_{106}$ of the well 106. In some embodiments, the width $W_{110}$ of the drift region 110 may be substantially the same as the width $W_{108}$ of the doped region 108. In an embodiment, the drift region 110 may be thicker than the doped region 108. For example, the thickness $T_{110}$ of the drift region 110 may be larger than the thickness $T_{108}$ of the doped region 108. In another embodiment, the drift region 110 may be thicker than the isolation structure 122. For example, the thickness $T_{110}$ of the drift region 110 may be larger than the thickness $T_{122}$ of the isolation structure 122.

The LDMOS device 100 may further include a gate stack 136 including a gate 132 over a gate dielectric layer 134. The gate stack 136 may be arranged above the semiconductor layer 102$c$ and at least partially overlapping the drift region 110. In some embodiments, the gate stack 136 may overlap at least half of the width of the drift region 110. For example, the gate 132 may overlap and extend beyond half of the width $W_{110}$ of the drift region 110. In another embodiment, the gate stack 136 may completely overlap the drift region 110 such that the drift region 110 is completely under the gate stack 136. A gate contact 128 may be coupled with the gate 132. For example, the gate contact 128 may directly contact the top of the gate 132. The gate dielectric layer 134 may be arranged between the gate 132 and a portion of the semiconductor layer 102$c$. The gate dielectric layer 134 may also overlie at least a portion of the drift region 110. In some embodiments, the gate dielectric layer 134 may directly contact the top surface of the drift region 110 and the top surface of the semiconductor layer 102$c$. In some embodiments, the top surface of the drift region 110 may be coplanar or substantially coplanar with the top surface of the semiconductor layer 102$c$. A source region 116 may be arranged in the semiconductor layer 102$c$ and laterally spaced from the drift region 110. The source region 116 may partially underlap the gate dielectric layer 134. A source contact 138 may be coupled with the source region 116. A portion of the semiconductor layer 102$c$ may be below the source region 116 such that the source region 116 does not extend vertically downwards to contact the insulator layer 102$b$.

Figure 1B:
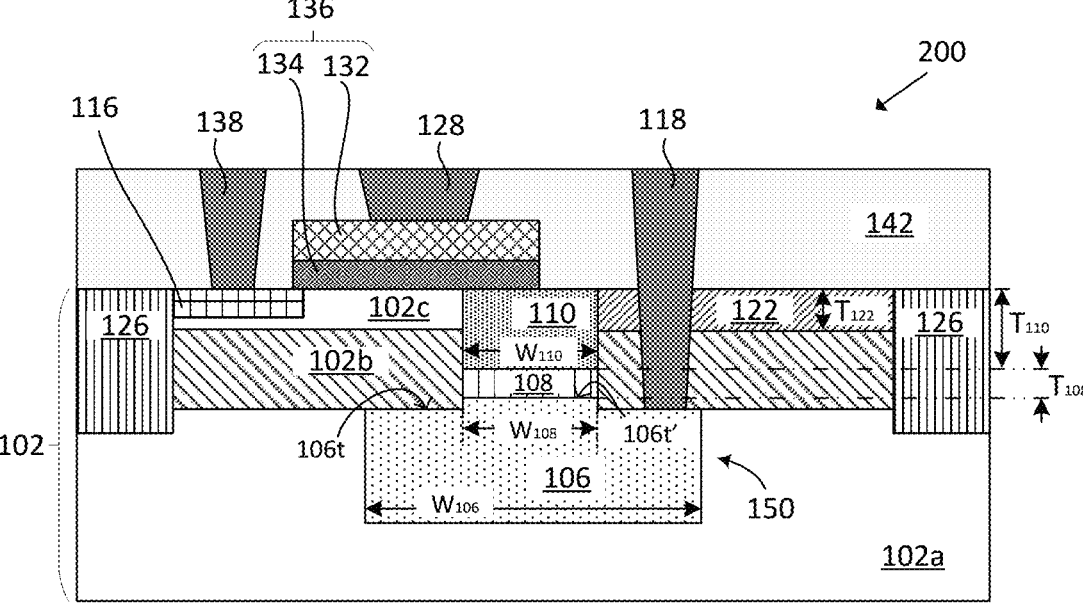
FIG. 1B shows a simplified cross-sectional view of a LDMOS device 200, according to another exemplary embodiment of the disclosure.
Figure 1C:
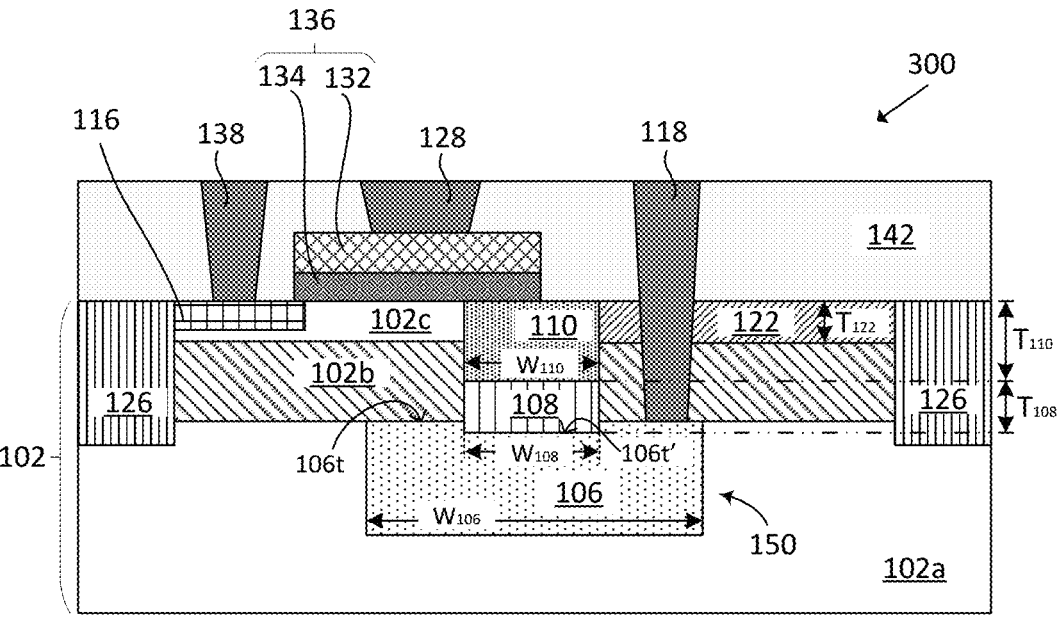
FIG. 1C shows a simplified cross-sectional view of a LDMOS device 300, according to yet another exemplary embodiment of the disclosure.

The embodiments shown in FIG. 1A may be modified to form alternative embodiments without departing from the scope of the disclosure. For example, FIGS. 1B and 1C show alternative embodiments where the well region 106 has a top surface having the portion 106$t'$ that is in contact with the bottom surface of the doped region 108 being higher or lower than the portion 106$t$ that is in contact with the bottom surface of the insulator layer 102$b$. As such, the corresponding thickness $T_{108}$ of the doped region 108 may be adjusted as required for device performance requirements. The positioning of the top and bottom surfaces of the drift region, doped region and well regions may be adjusted by adjusting the implantation process conditions and the epitaxy growth process for the drift region and doped region.

Figure 2:
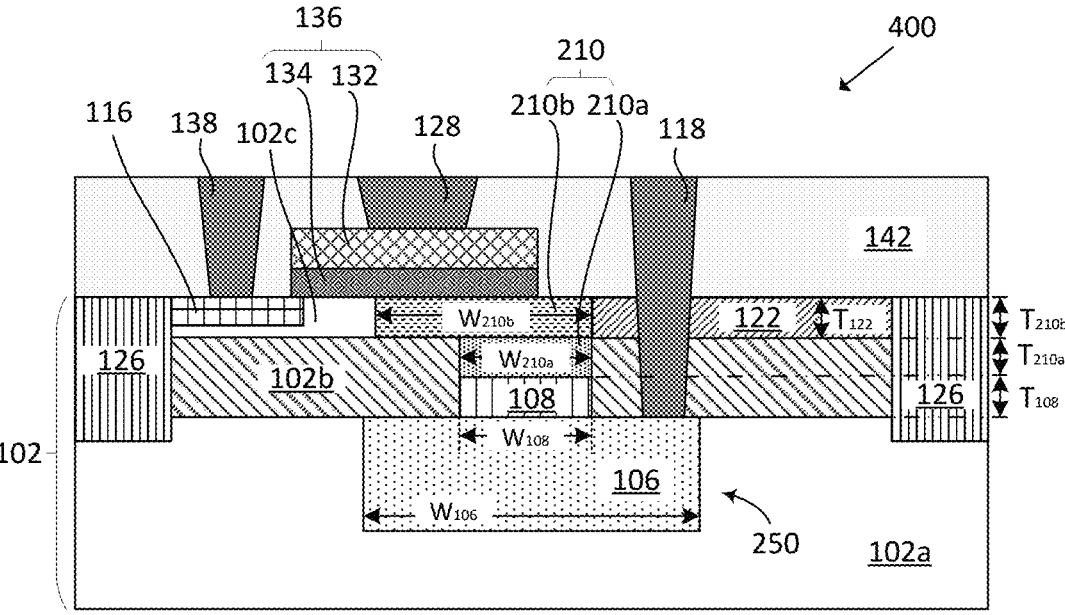
FIG. 2 shows a simplified cross-sectional view of a LDMOS device 400, according to an alternative exemplary embodiment of the disclosure.

FIG. 2 shows a LDMOS device 400, according to another embodiment of the disclosure. Like numerals in FIG. 2 may denote like features in FIG. 1A. LDMOS device 400 may have a drain region 250 that includes a drift region 210 having a wider upper portion 210$b$ over a narrower lower portion 210a. For example, the upper portion 210b may have a width $W_{210b}$ that is larger than the width $W_{210a}$ of the lower portion 210a. In an embodiment, the lower portion 210a may substantially have the same width as that of the doped region 108. For example, the width $W_{210a}$ of the lower portion 210a of the drift region 210 may be equal to the width $W_{108}$ of the doped region 108. In some embodiments, the lower portion 210a of the drift region 210 may have a thickness $T_{210a}$ that is less than the thickness of the insulator layer 102b. For example, the sum of the thickness $T_{108}$ of the doped region and the thickness $T_{210a}$ of the lower portion 210a may be substantially the same as the thickness of the insulator layer 102b.

The drift region 210 may be partially positioned in the semiconductor layer 102c and partially positioned in the insulator layer 102b. For example, the upper portion 210b may be arranged in the semiconductor layer 102c of the substrate 102 while the lower portion 210a may be arranged in the insulator layer 102b of the substrate 102. In an embodiment, the top surface of the drift region 210 may be coplanar or substantially coplanar with the top surface of the isolation structure 122. In another embodiment, the upper portion 210b is integrally joined to the lower portion 210a. In an example, the upper portion 210b and the lower portion 210a may share a common interface. In yet other embodiments, the thickness $T_{210b}$ of the upper portion 210b of the drift region 210 may be substantially the same as the thickness $T_{122}$ of the isolation structure 122. The upper portion 210b of the drift region 210 may partially overlap the insulator layer 102b, for example, upper portion 210b may comprise a bottom surface directly contacting a top surface of the insulator layer 102b. The lower portion 210a of the drift region 210 may have a bottom surface in direct contact with the doped region 108. The doped region 108 may be arranged in the insulator layer 102b and in direct contact with the well 106, while the well 106 may be arranged in the base layer 102a.

Figure 3A:
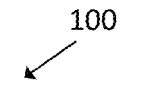
FIGS. 3A to 3F show simplified cross-sectional views representing an exemplary fabrication process flow for the LDMOS device shown in FIG. 1A, according to an embodiment of the disclosure.
Figure 3A:
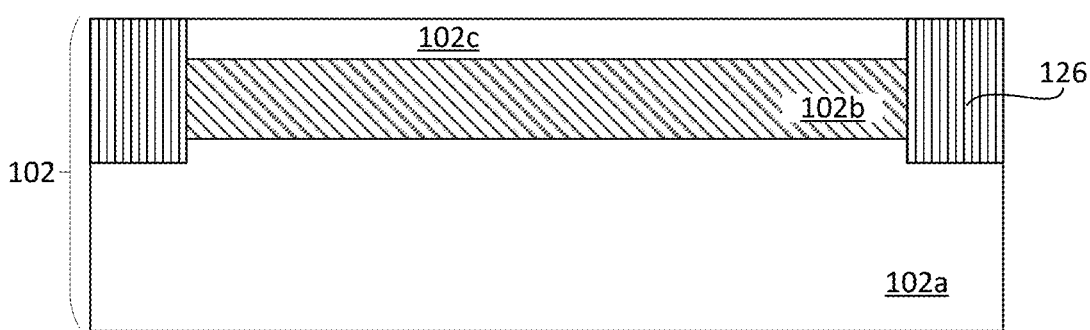

FIGS. 3A to 3F show a fabrication process flow for the LDMOS device 100 shown in FIG. 1A, according to some embodiments of the disclosure. FIG. 3A shows the LDMOS device 100 at an exemplary processing step, for example, after the formation of shallow trench isolation (STI) structures 126 in the substrate 102, according to an embodiment of the disclosure. The formation of the STI structures 126 may include forming openings in the substrate 102 by a material removal process. For example, a layer of photoresist may be deposited over the substrate 102, exposed and developed to form suitable photoresist patterns. A wet etch or dry etch process may be used to form openings in the substrate 102 by removing selected portions of the substrate 102, for example, regions of the substrate 102 that are not covered by the photoresist patterns. The photoresist patterns may subsequently be removed at this step or a later step. A layer of a suitable dielectric, for example, silicon dioxide, may be deposited in the openings. A suitable material process, for example, chemical mechanical planarization (CMP) may be used to remove unwanted portions of the dielectric layer, for example, over the top surface of the semiconductor layer 102c, so as to leave behind a portion of the dielectric layer in the openings to form the STIs.

Figure 3B:
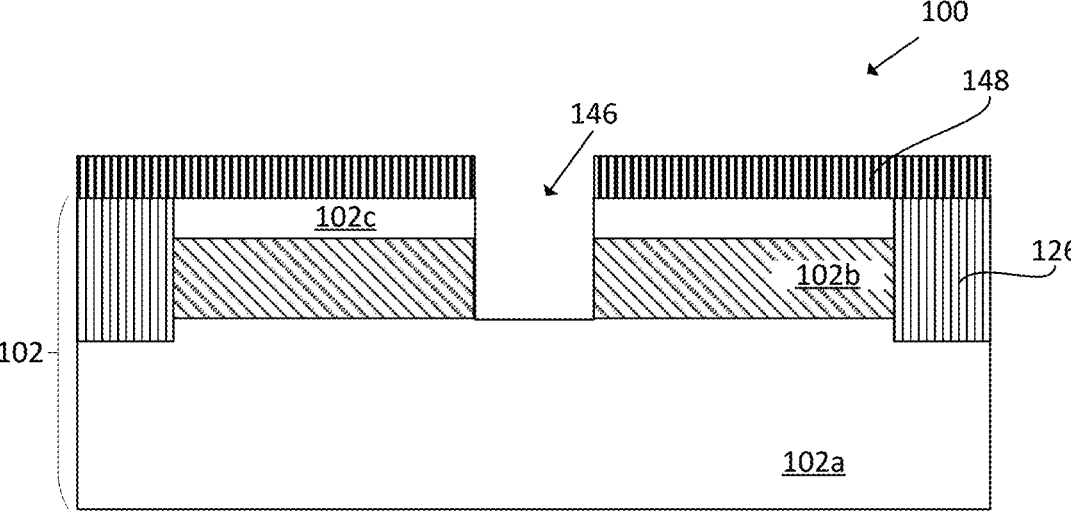

FIG. 3B shows the LDMOS device 100 after the formation of opening 146 in the substrate 102, according to an embodiment of the disclosure. A mask layer 148 may first be formed by depositing and patterning a layer of a suitable mask material, for example, silicon nitride, over the top surface of the semiconductor layer 102c. A suitable material removal process or processes may then be applied to remove portions of the semiconductor layer 102c and the insulator layer 102b which are not covered by the mask layer 148, thereafter forming opening 146 which may terminate at the top surface of the base layer 102a, exposing a portion of the base layer 102a. In some embodiments, the material removal process may be allowed to continue until a portion of the base layer 102a has been removed, such that the bottom surface of the opening 146 is lower than the bottom surface of the insulator layer 102b. The material removal process may be a single step or multiple step process, including for example, a wet etch or dry etch process.

Figure 3C:
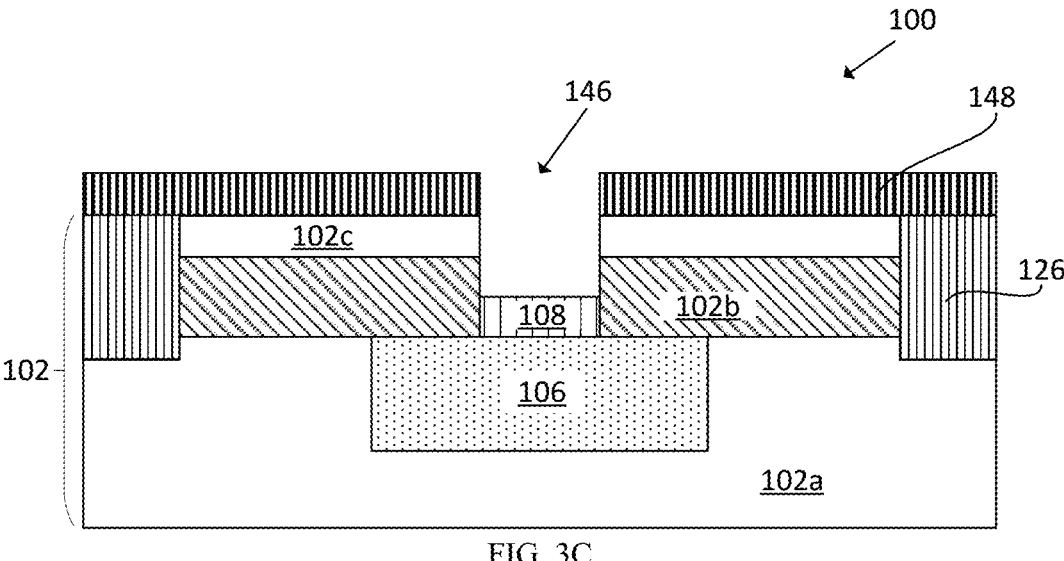

Referring now to FIG. 3C, which shows the LDMOS device 100 at a subsequent processing step, a well 106 is formed in the base layer 102a and a doped region 108 is formed over the well 106. The formation of the well 106 may include doping a portion of the base layer 102a below the opening 146. The doping process may include implantation of a suitable n-type dopant, for example, arsenic, phosphorus, or any other suitable n-type dopants followed by annealing. The doped region 108 may be formed by epitaxial growth of a layer of a suitable semiconductor, for example, silicon or any other suitable semiconductor. In an embodiment, the doped region 108 may be formed by an in situ doped epitaxial deposition process. The semiconductor layer may be grown over the well 106 within the opening 146, partially filling up the opening 146. In an embodiment, the semiconductor layer may be in-situ doped by a suitable n-type dopant, for example, arsenic, phosphorus, or any other suitable n-type dopants. In some embodiments, additional implantation processes may be employed to attain the desired doping concentration and corresponding thickness $T_{108}$ of the doped region 108. For example, after epitaxial growth of a n-doped semiconductor layer in the opening 146, an additional implantation process may be carried out to form doped region 108 having a higher doping concentration than the epitaxially grown n-doped semiconductor layer and the well 106.

Figure 3D:
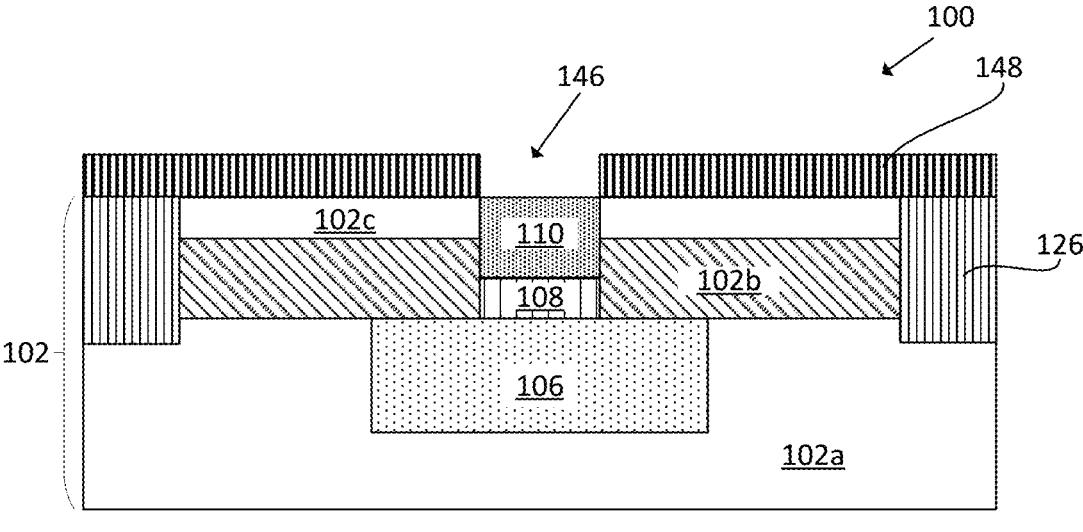

FIG. 3D shows the LDMOS device 100 after the formation of a drift region 110, according to an embodiment of the disclosure. An epitaxial structure may first be formed in the opening 146 by epitaxial growth of a layer of suitable semiconductor material, for example, silicon or any other suitable semiconductor. The semiconductor material may be grown over the doped region 108, thereby filling up the opening 146, such that the top surface of the epitaxial structure is at least the same height as the top surface of the semiconductor layer 102c. In an embodiment, the epitaxial structure may be in-situ doped by a suitable n-type dopant, for example, arsenic, phosphorus, or any other suitable n-type dopants. The semiconductor materials used for growing the doped region 108 and the drift region 110 may be the same in some embodiments but may also be different in other embodiments.

Figure 3E:
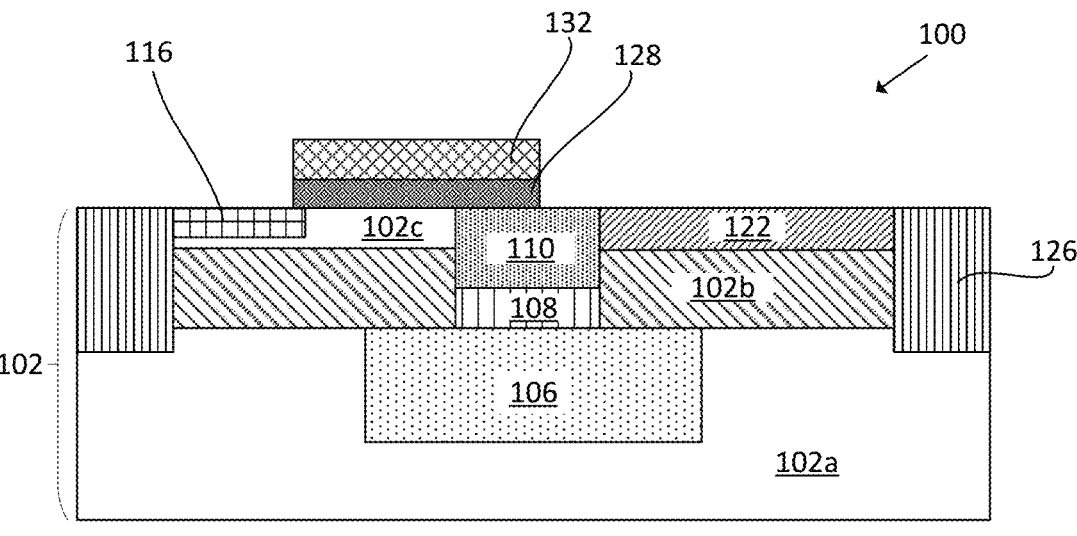

FIG. 3E shows the LDMOS device 100 at a subsequent processing step. Mask layer 148 is removed by a suitable material removal process, for example an etch process, including a wet etching process using hot phosphoric acid. An isolation structure 122 may subsequently be formed in the substrate 102 by removing a portion of the semiconductor layer 102c between the drift region 110 and the STI structure 126 to form an opening, and then filling the opening with a suitable dielectric material, for example, silicon dioxide. The removal of the portion of the semiconductor layer 102c may include a suitable patterning process, for example etching with a patterned photoresist mask. Subsequently, to obtain a planar or substantially planar top surface where the top surfaces of STI structures 126, semiconductor layer 102c, drift region 110 and isolation structure 122 are coplanar or substantially coplanar, a suitable material removal process may be performed prior to the formation of the gate stack 136. A suitable material removal process may be, for example, chemical mechanical planarization or an etching process.

The gate stack 136 including the gate dielectric layer 134 and the gate 132 may be formed by depositing a layer of a suitable dielectric material, for example, silicon dioxide, high dielectric constant material, or any other suitable dielectric material over the top surfaces of drift layer 110 and the semiconductor layer 102c, followed by a layer of a suitable conductive material, for example, polysilicon, titanium nitride, tantalum nitride, or any other suitable conductive material over the dielectric layer. The term "high dielectric constant material" may refer to a dielectric material having a dielectric constant higher than 7. The dielectric layer and the conductive layer may subsequently undergo a suitable patterning process to form the gate stack 136 including the gate 132 and the gate dielectric layer 134. For example, a mask, such as a patterned layer of photoresist, may be formed over the conductive layer, and a material removal process, such as a wet or dry etch process, may be used to remove unwanted portions of the conductive layer and the dielectric layer that are not covered by the mask. In some embodiments, the mask may be removed after the material removal process, leaving the gate stack behind. In other embodiments, the mask may remain over the gate stack 136 during the subsequent doping process. In an embodiment, another mask layer may be formed over the gate stack 136 and other areas of the substrate 102, leaving the area over the intended source region 116 exposed. In other embodiments, the mask layer remaining from the gate stack patterning process may be used as a mask for the doping process. The intended source region 116, which is the exposed portion of the semiconductor layer 102c laterally adjacent to the gate dielectric layer 134, is then implanted with a suitable n-type dopant, for example, arsenic, phosphorus, or any other suitable n-type dopant. The mask layer may subsequently be removed after the doping process.

Figure 3F:
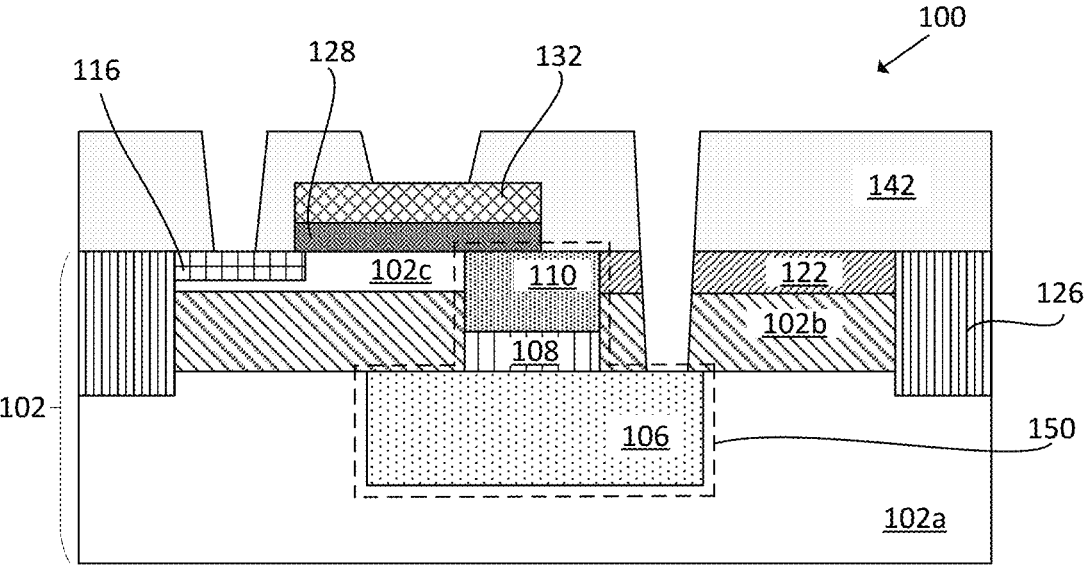

Referring now to FIG. 3F, an insulating layer, for example, the interlayer dielectric (ILD) layer 142 may first be formed over the gate 132, source region 116, drift region 110, isolation structure 122 and STI structures 126. Thereafter, openings may be formed in the ILD layer 142 for the forming of contact structures, for example, gate contact 128 and source contact 138 (as shown in FIG. 1A). In an embodiment, some openings may extend through the isolation structure 122 and insulator layer 102b to the top surface of well 106, for example, for the forming of drain contact 118.

The ILD layer 142 may be formed by depositing a layer of a suitable dielectric material, for example, silicon dioxide, high density plasma (HDP) undoped silicate glass (USG), tetraethyl orthosilicate (TEOS), or any other suitable dielectric material, followed by a suitable material removal process, for example, chemical mechanical planarization or etching process.

To form the openings for contact structures as aforementioned, a suitable material removal process including the use of a patterned mask may be applied. As an example, a layer of photoresist may be deposited over the ILD layer 142 and patterned to form a suitable patterned mask. A wet etch or dry etch process may be used to remove portions of the insulating layer, as well as portions of the isolation structure 122 and insulator layer 102b which are not covered by the patterned mask, forming openings extending to the top surfaces of the source region 116, gate 132 and well 106. In an embodiment, the openings for the gate contact 128 and source contact 138 may be formed in a separate step from the opening for the drain contact 118. The photoresist pattern may subsequently be removed. To form the LDMOS device 100 shown in FIG. 1A, a layer of a suitable conductive material, for example, copper, tungsten, or any other suitable conductive material may be deposited to fill up the openings to at least the top surface of the insulating layer. The excess conductive material, for example, over the top surface of the insulating layer may subsequently be removed by a suitable material removal process, for example, chemical mechanical planarization or etching process.

Figure 4A:
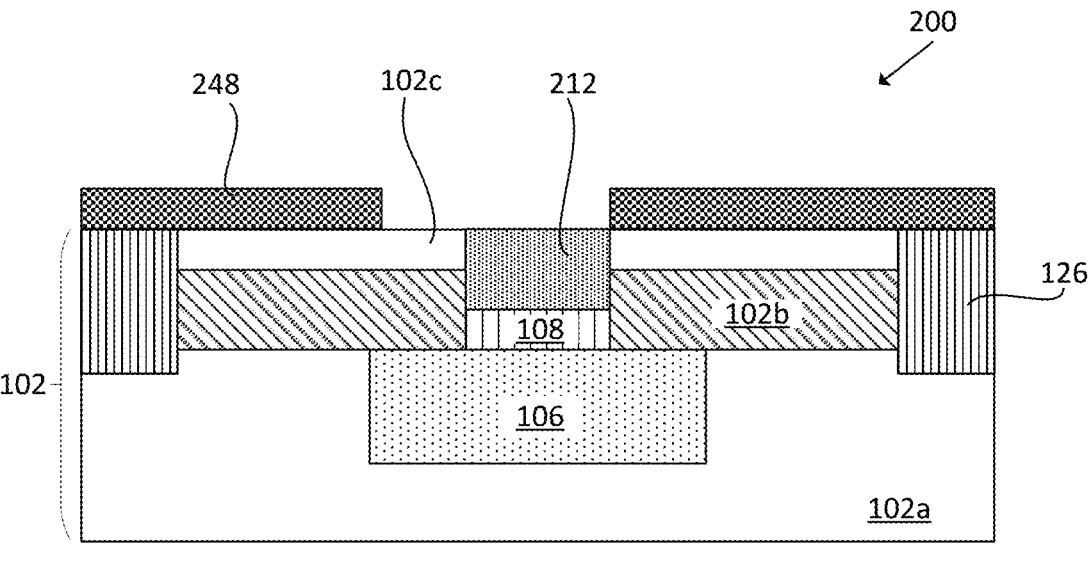
FIGS. 4A to 4D show simplified cross-sectional views representing an exemplary fabrication process flow for the LDMOS device shown in FIG. 2, according to an alternative embodiment of the disclosure.

FIGS. 4A to 4D show an alternative fabrication process flow after the process step shown in FIG. 3D. Like reference numerals in FIGS. 4A-4D refer to like features in FIGS. 3A-3D. Referring first to FIG. 4A, a mask layer 248 is formed over the semiconductor layer 102c, the mask layer 248 having an opening to expose the doped epitaxial structure 212 and a portion of the semiconductor layer 102c immediately adjacent to and in contact with the doped epitaxial structure 212. In an embodiment, mask layer 248 may be formed after the previous mask layer 148 is removed from the top surface of the semiconductor layer 102c. In another embodiment, mask layer 148 may undergo further patterning processes to form mask layer 248. A suitable material for mask layer 248 may include silicon nitride, as an example. In an embodiment, the doped epitaxial structure 212 may include n-type dopants.

Figure 4B:
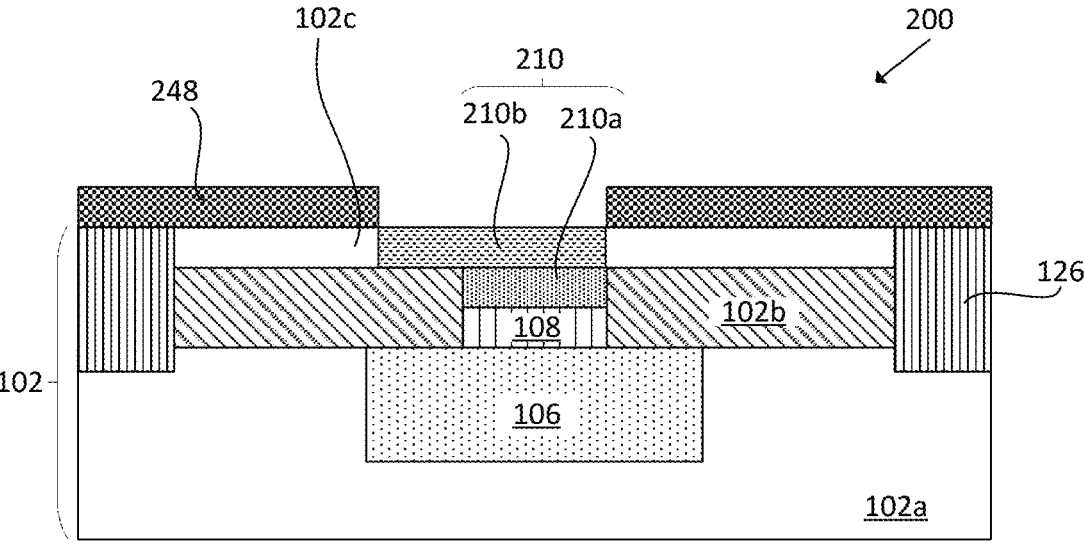

Next referring to FIG. 4B, an upper portion of the doped epitaxial structure 212 and the exposed portion of the semiconductor layer 102c may be doped by implanting a suitable n-type dopant, for example, arsenic, phosphorus, or any other suitable n-type dopant to form the upper portion 210b of the resulting drift region 210. The drift region 210 may include a lower portion 210a of the initial doped epitaxial structure 212 directly below and in contact with the upper portion 210b. The mask layer 248 may subsequently be removed by a suitable method.

Figure 4C:
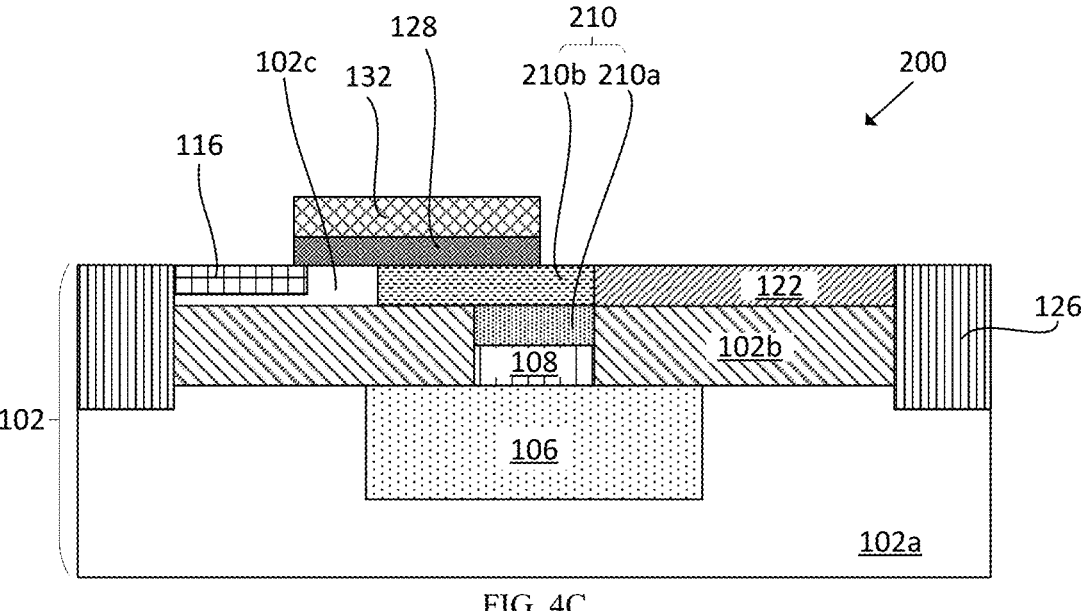

FIG. 4C shows the LDMOS device 400 after the formation of an isolation structure 122, source 116 and the gate stack. The formation of isolation structure 122, gate stack and source region 116 may be similar to the processes described for FIG. 3E, and hence shall not be repeated herein.

Figure 4D:
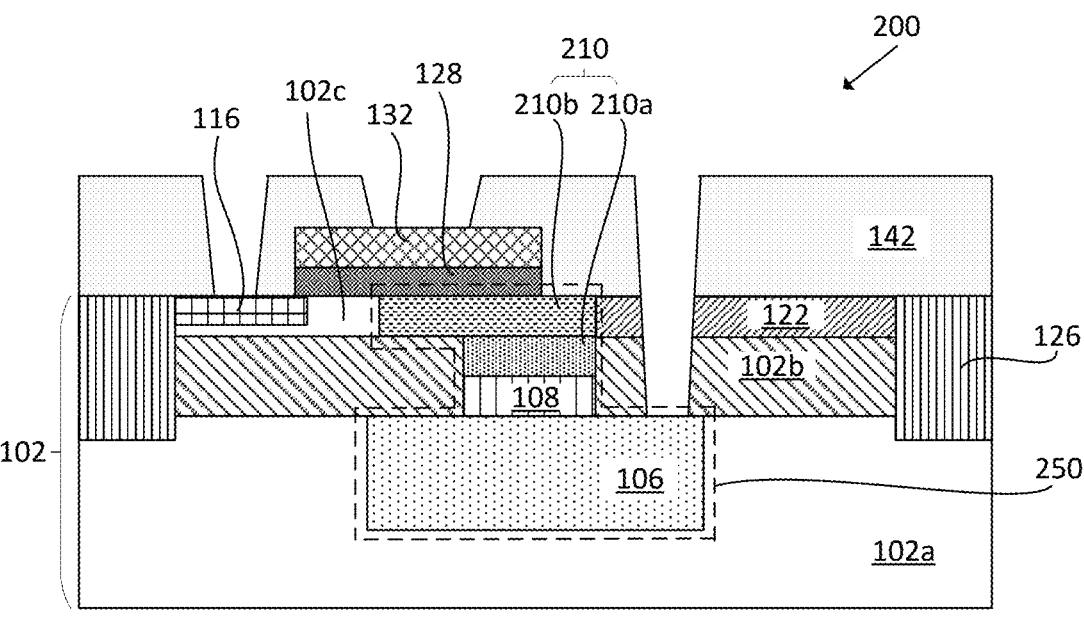

FIG. 4D shows the LDMOS device 400 after an insulating layer, for example, the interlayer dielectric (ILD) layer 142 is formed over the gate 132, source region 116, drift region 110, isolation structure 122 and STI structures 126. Subsequently, openings may be formed in the ILD layer 142, for the forming of contact structures, for example, gate contact 128 and source contact 138 (as shown in FIG. 2). Openings may also extend through the isolation structure 122 and insulator layer 102b to the top surface of well 106, for example, for the forming of drain contact 118. The openings may then be filled with a suitable conductive material to from the contact structures, for example, drain contact 118, gate contact 128 and source contact 138 shown in FIG. 2. The process of forming the insulating layer, openings and corresponding contact structures may be similar to the processes described for FIG. 3F and need not be repeated here.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A semiconductor device comprising:
   a semiconductor layer over an insulator layer and a base layer under the insulator layer;
   a well in the base layer;
   a doped region above and directly contacts the well, wherein the doped region is in the insulator layer;
   a drift region above and coupled with the doped region, wherein the drift region is at least partially in the semiconductor layer; and
   a gate stack partially over the semiconductor layer and partially over drift region.

2. The semiconductor device of claim 1, wherein the drift region further comprises
   an upper portion and a lower portion, the upper portion is in the semiconductor layer wherein a top surface of the drift region is coplanar with a top surface of the semiconductor layer and the lower portion is in the insulator layer wherein a bottom surface of the drift region is positioned in the insulator layer.

3. The semiconductor device of claim 1, further comprising an isolation structure adjacent to the drift region and over the insulator layer.

4. The semiconductor device of claim 3, wherein the isolation structure has a top surface and the drift region has a top surface, and the top surface of the isolation structure is substantially coplanar with the top surface of the drift region.

5. The semiconductor device of claim 4, wherein the semiconductor layer has a top surface and the top surface of the drift region is substantially coplanar with the top surface of the semiconductor layer.

6. The semiconductor device of claim 3, wherein the isolation structure has a first thickness and the semiconductor layer has a second thickness, and the first thickness is substantially the same as the second thickness.

7. The semiconductor device of claim 1, wherein the doped region has a first width and the drift region has a second width, and the first width is substantially the same as the second width.

8. The semiconductor device of claim 1, wherein the semiconductor layer has a top surface directly contacting the gate stack and the drift region has a top surface directly contacting the gate stack, and the top surface of the semiconductor layer is substantially coplanar with the top surface of the drift region.

9. A semiconductor device comprising:
   a semiconductor layer over an insulator layer and a base layer under the insulator layer, wherein the insulator layer has a bottom surface;
   a well in the base layer, wherein the well has a top surface including a first portion contacting the bottom surface of the insulator layer and a second portion adjacent to the first portion;
   a doped region above and coupled with the well, wherein the doped region is in the insulator layer and the doped region has a bottom surface contacting the second portion of the top surface of the well;
   a drift region above and coupled with the doped region, wherein the drift region is at least partially in the semiconductor layer; and
   a gate stack having a first portion over the semiconductor layer and a second portion over the drift region, wherein the second portion is adjacent to the first portion.

10. The semiconductor device of claim 9, further comprising an isolation structure adjacent to the drift region and over the insulator layer.

11. The semiconductor device of claim 10, further comprising a shallow trench isolation structure adjacent to the isolation structure, wherein the isolation structure has a first side surface and a second side surface opposite to the first side surface, and the first side surface directly contacts the shallow trench isolation structure and the second side surface directly contacts the drift region.

12. The semiconductor device of claim 11, wherein the isolation structure has a top surface and the shallow trench isolation structure has a top surface substantially coplanar with the top surface of the isolation structure.

13. The semiconductor device of claim 9, further comprising a drain contact extending through the insulator layer to couple to the well, wherein the drain contact is laterally spaced from the drift region by at least a portion of the insulator layer.

14. The semiconductor device of claim 13, further comprising an isolation structure adjacent to the drift region and over the insulator layer, and the drain contact extends through the isolation structure.

15. The semiconductor device of claim 13, wherein the drain contact directly contacts
   the first portion of the top surface of the well.

16. A method of fabricating a semiconductor device, the method comprising:
   forming an opening in a substrate, the substrate comprising a semiconductor layer over an insulator layer and a base layer under the insulator layer, wherein the opening terminates at the base layer;

forming a well in a base layer under the opening;

forming a doped region over and directly contacting the well and within the opening, wherein the doped region is in the insulator layer;

forming a drift region over the doped region, wherein the drift region is at least partially in the semiconductor layer; and forming a gate stack partially over the semiconductor layer and partially over the drift region.

17. The method of claim 16, further comprising forming an opening in the insulator layer to form a drain contact to the well.

18. The semiconductor device of claim 1, wherein the insulator layer has a top surface in contact with the semiconductor layer and the drift region further comprises an upper portion and a lower portion, the upper portion is within the semiconductor layer and the lower portion is within the insulator layer.

19. The semiconductor device of claim 3, wherein the isolation structure has a bottom surface at the same depth as a bottom surface of the semiconductor layer.

\* \* \* \* \*